United States Patent [19]

Delivorias

[11] Patent Number: 4,542,580
[45] Date of Patent: Sep. 24, 1985

[54] METHOD OF FABRICATING N-TYPE SILICON REGIONS AND ASSOCIATED CONTACTS

[75] Inventor: Peter Delivorias, Peabody, Mass.

[73] Assignee: Prime Computer, Inc., Natick, Mass.

[21] Appl. No.: 466,076

[22] Filed: Feb. 14, 1983

[51] Int. Cl.⁴ .......................................... H01L 21/225
[52] U.S. Cl. ........................................ 29/590; 29/571; 29/591; 148/1.5; 148/188; 148/190; 148/176
[58] Field of Search ........................ 29/571, 590, 591; 148/1.5, 176, 188, 190; 219/121 L

[56] References Cited

U.S. PATENT DOCUMENTS

| | | | |
|---|---|---|---|
| 3,620,814 | 11/1971 | Clark et al. | 117/106 R |
| 3,912,557 | 10/1975 | Hochberg | 148/188 |
| 3,915,765 | 10/1975 | Cho et al. | 148/175 |
| 3,957,474 | 5/1976 | Kobayashi et al. | 156/605 |
| 3,965,385 | 6/1976 | Feist et al. | 313/366 |
| 4,041,518 | 8/1977 | Shemizu et al. | 148/188 |
| 4,042,006 | 8/1977 | Engl et al. | 427/43 |
| 4,214,918 | 7/1980 | Gat et al. | 148/1.5 |
| 4,249,141 | 2/1981 | Brown et al. | 148/1.5 |
| 4,249,968 | 2/1981 | Gardiner et al. | 148/188 |
| 4,260,649 | 4/1981 | Dension et al. | 427/53.1 |
| 4,292,091 | 9/1981 | Togei | 148/1.5 |
| 4,318,752 | 3/1982 | Tien | 148/1.5 |
| 4,319,954 | 3/1982 | White et al. | 156/628 |
| 4,322,253 | 3/1982 | Pankoue et al. | 148/1.5 |
| 4,340,617 | 7/1982 | Deutsch et al. | 427/53.1 |
| 4,400,715 | 8/1983 | Barbee et al. | 357/4 |

FOREIGN PATENT DOCUMENTS 56-15035  2/1981  Japan ................................. 148/1.5

OTHER PUBLICATIONS

Influence of AsH₃, PH₃, and B₂H₆ on . . . , J. Electrochem. Soc., Solid State Science and Technology, Jan., 1973, pp. 106–109.
In-Process Thickness Monitor for Polycrystalline Silicon Deposition, J. Elec. Soc., Solid-State Sci. & Tech., Jan., 1972, pp. 112–114.
Diffusion of Impurities in Polycrystalline Silicon, J. Appl. Phys., vol. 43, No. 1, Jan. 1972, pp. 83–91.
Laser-Induced Vapor Deposition of Silicon, Applied Pysics Letter (35) 8, Oct. 15, 1979, pp. 626–627.
Flash Evaporation of Compounds with a Pulsed-Discharge CO₂ Laser, Applied Optics, May 1976, vol. 15, No. 5, pp. 1327–1330.
Effect of Emitter Contact on Curent Gain of Silicon Bipolar Devices, IEEE Transactions on Electron Devices, vol. Ed-27, No. 11, 11/80, pp. 2051–2055.

Primary Examiner—Brian E. Hearn
Assistant Examiner—Hunter L. Auyang
Attorney, Agent, or Firm—Lahive & Cockfield

[57] ABSTRACT

Disclosed are improved bipolar and field effect transistors having n-type silicon regions and associated electrical contacts comprising monocrystalline silicon doped with arsenic and phosphorus. The transistors are fabricated by depositing on a silicon substrate a coating of amorphous silicon comprising a first layer heavily doped with phosphorus and a second layer below the first doped with arsenic. Energy is selectively applied to melt the coating. As the coating resolidifies and cools, arsenic diffuses into the substrate to form shallow n-type regions which are annealed by heat from the coating. Heavily phosphorus-doped, conductive monocrystalline silicon forms above the n-type regions on the substrate, whereas polycrystalline silicon forms above dielectric or other materials. Selective removal of the polysilicon yields shallow, annealed n-type regions integral with self-registered contacts. The resulting transistors have low RC time constants and low contact resistance.

8 Claims, 6 Drawing Figures

METHOD OF FABRICATING N-TYPE SILICON REGIONS AND ASSOCIATED CONTACTS

BACKGROUND OF THE INVENTION

This invention relates to solid state physics. More particularly it relates to improved shallow n-type regions and associated electrical contacts in integrated microelectronic circuits, and to improved transistors characterized by low RC time constants and low contact resistance.

The advantages of shallow junctions in solid state microelectronic devices has long been recognized. Shallow n-type silicon regions consisting of uniformly doped and uniformly crystalline silicon can form junctions having a low resistance and a low capacitance. Transistors made with such shallow n-type regions thus are characterized by low power consumption and short switching times. Such regions must be substantially uniformly doped and annealed in order to avoid subsequent current leakage and spiking, and it has been necessary to sputter a barrier layer of refractory metal or to deposit an alloy of silicon, aluminum, and/or copper to protect the junction from diffusing ions during subsequent deposition of contacts and conductors. See, for example, *Effect of Emitter Contact on Current Gain of Silicon Bipolar Devices,* T. H. Ning et al., IEEE Transactions On Electronic Devices, Vol. Ed-27, No. 11, November 1980.

SUMMARY OF THE INVENTION

The invention provides improved n-type silicon active regions and their associated contacts in integrated circuits. These are fabricated by an economical, step saving method wherein n-type silicon regions and associated contacts are formed in a single operation. A coating of amorphous silicon is applied, for example by vapor deposition, to the exposed surfaces of a monocrystalline silicon substrate, and optionally to areas of the substrate protected by dielectric or other coatings. The amorphous coating includes a first layer heavily doped with phosphorus, preferably at levels approaching its maximum solubility in silicon, and a second layer between the first and the exposed surface of the monocrystalline substrate doped with arsenic. The coating is then melted, preferably with a laser beam or electron beam, and allowed to resolidify and cool. During cooling, arsenic atoms diffuse into the monocrystalline substrate to form shallow (preferably $\leq 0.1$ micrometers) n-type regions which, because of the ideal lattice size of arsenic and the annealing induced by heat flow from the cooling coating, form an excellent junctions with adjacent p-type regions thereby avoiding parasitic leakage current and spiking. Regions of the melted layer adjacent monocrystalline silicon solidify on cooling as monocrystalline, heavily phosphorus-doped, and electrically conductive silicon integral with the n-type silicon regions.

In regions of the amorphous coating overlying dielectric or other materials protecting the substrate semiconductor, the coating solidifies as polycrystalline silicon. Consequently, a subsequent selective removal of polysilicon by plasma or aqueous etch techniques results in shallow n-type silicon regions having self-registered electrical contacts. Such regions, when incorporated into bipolar or field effect transistors, are characterized by low RC time constants and low contact resistance.

Accordingly, it is an object of the invention to avoid the separate step of applying a barrier layer of refractory metal or the like over shallow n-type silicon regions during fabrication of integrated circuits. Other objects are to provide an improved method of fabricating integrated bipolar and n-MOS field effect transistors, to fabricate bipolar transistors having low RC time constants, and to provide a method of simultaneously fabricating a shallow n-type region and its associated electrical contact. Yet another object is to provide integrated circuits comprising compact transistors having low contact resistance, and self-registered contacts. Another object is to provide in an integrated circuit a structure comprising a shallow, annealed, n-type silicon region integral with its associated contact wherein the structure comprises a region of monocrystalline silicon doped with a preponderance of arsenic in the portion of its volume defining the active n-type region and doped heavily with phosphorus in the portion of its volume defining the contact.

BRIEF DESCRIPTION OF THE DRAWING

These and other objects and features of the invention will be apparent from the following description and from the drawing wherein like reference characters in the respective drawn figures indicate corresponding parts and wherein.

DESCRIPTION

Figure 1:
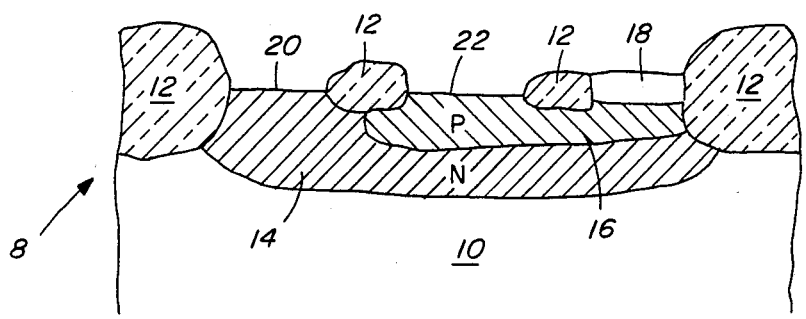
FIGS. 1-4 are schematic, cross-sectional views of a portion of an integrated circuit illustrating, in accordance with the invention, the steps in fabricating the emitter and contacts for the emitter and the collector in an NPN bipolar transistor.

Referring to the drawing, FIGS. 1-4 illustrate stages in the fabrication of an NPN transistor 8 on a monocrystalline silicon substrate 10 having islands of silicon dioxide dielectric 12, a previously fabricated p-type monocrystalline silicon region 16, and a masking composition 18.

As shown in FIG. 1, at the outset the substrate defines exposed surface areas 20 and 22 (on the order of 3 microns in diameter) of monocrystalline silicon substrate 10 bounded by dielectric material 12. The first step in the fabrication process is to apply an amorphous silicon coating 24 over the surface of substrate 10. Coating 24 has an upper layer (represented schematically in FIG. 2 as a plurality of star points) comprising amorphous silicon heavily doped with phosphorus atoms, and a lower layer between the phosphorus layer and the substrate 10 (represented as a plurality of circular points) comprising amorphous silicon doped with arsenic. Preferably the concentration of phosphorus in the upper layer is at or close to the maximum solubility of phosphorus in silicon (greater than about $10^{21}$ atoms/cm$^3$). The layer 24 thus comprises amorphous silicon containing an upper layer doped with a preponderance of phosphorus and a lower layer doped with a preponderance of arsenic.

The layer 24 may be deposited by techniques well known to those skilled in the art, for example, by low pressure thermal decomposition of a suitable silane-arsine mixed vapor followed by a silane-phosphine mixed vapor or by sputtering. The coating may be deposited by vapor decomposition at a rate of about 90 Angstroms per minute at a temperature of about 450°–500° C. to a depth preferably on the order of 2–5 micrometers. The use of an amorphous silicon deposit prevents uncontrolled diffusion of phosphorus in subsequent steps as disclosed below along crystalline planes such as <1-1-0> in polycrystalline silicon.

Figure 2:
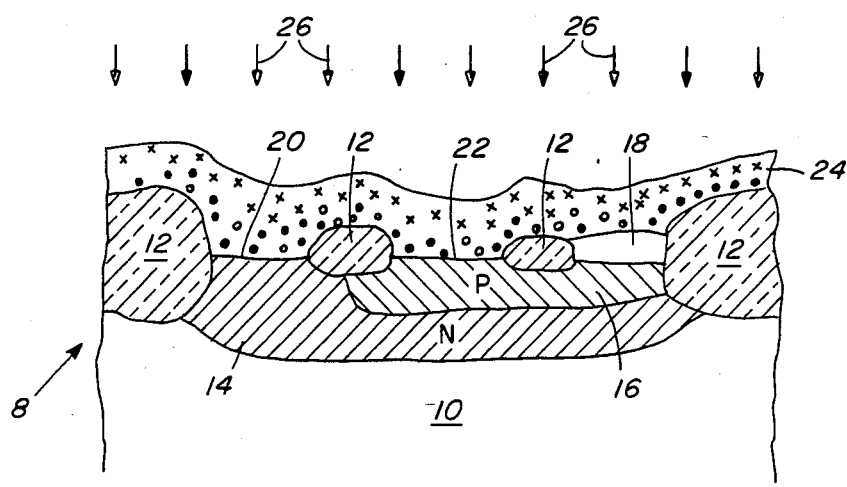

In the next step of the process, illustrated in FIG. 2, the coating 24 is selectively heated so that its phosphorus-containing volume and at least a portion of its arsenic-containing volume is converted to a melt. Thermal energy is added to the coating 24 so as to avoid melting of the dielectric islands 12 or underlying substrate volumes 14 or 16. The energy is preferably applied by means of a high energy electron beam or a laser beam, illustrated at 26, and most preferably by a short duration, high-intensity pulsed beam. One advantage of the use of a beam is that it can be easily directed to desired areas of the layer 24. The energy and pulse duration of the beam is adjusted such that the coating 24 is melted without damage to the monocrystalline silicon adjacent surfaces 20 and 22 of substrate 10. The precise values of the energy and pulse length of the beam will vary depending upon the thickness of the coating and the heat content of the coating required to induce the desired depth of diffusion of arsenic into the surfaces 20 and 22 as disclosed below. Generally, beam energies of about 1.1 joules/cm$^2$ or greater will suffice. The heating process may be optimized empirically in particular embodiments so as to achieve the objectives set forth below.

Figure 3:
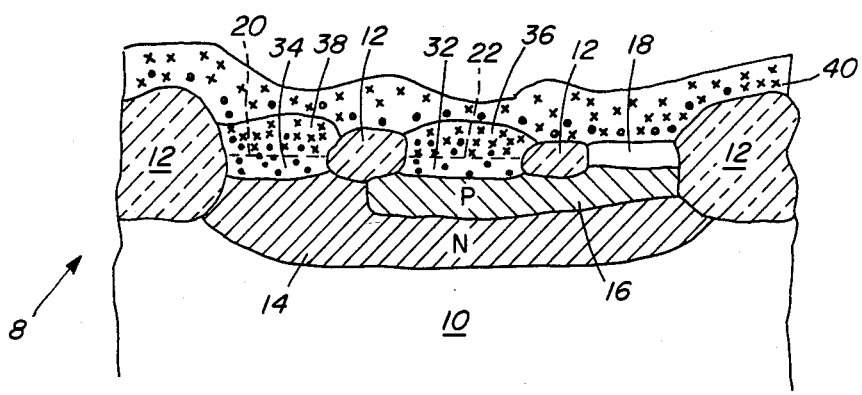

In the next step of the process, illustrated in FIG. 3, the coating is allowed to cool and resolidify. During this process, arsenic atoms from the lower layer of coating 24 diffuse into the surfaces 20 and 22 of substrate 10 to form arsenic-doped regions 32 and 34. Simultaneously, heat of crystallization and cooling flowing from the coating 24 anneals the regions 32 and 34. Because of this "self-annealing" and the ideal lattice size of arsenic, regions 34 and 32 form uniformly monocrystalline and uniformly arsenic-doped n-type silicon regions to a depth preferably on the order of less than about 0.1 micrometer. The precise depth of the junctions depends upon the concentration of arsenic deposited, on the amount of heat added to the coating, and on the depth of the heating.

During the cooling and resolidifying process, volumes of the coating directly above substrate surfaces 20 and 22 recrystallize as arsenic-doped and heavily phosphorus-doped monocrystalline silicon regions 36 and 38 which are integral and in direct electrical contact with the shallow-n-type silicon regions 32 and 34. Regions 36 and 38 are bounded by dielectric islands 12 and are electrically conductive because of their high phosphorus content. At this point in the process a uniform junction 42, active n-type region 32, and its associated contact 36 have all been defined within the pre-existing p-type monocrystalline silicon 16 or in integral, freshly crystallized monocrystalline material formed from the amorphous coating. The junction 42 is formed at the interface of a region doped essentially with arsenic, and the concentration of arsenic generally decreases upwardly. In the uppermost volume of the monocrystalline structure, phosphorus predominates at a concentration close to its maximum solubility.

In the illustrated embodiment, the remaining volume of coating 24, illustrated at 40 in FIG. 3, recrystallizes as polycrystalline silicon. While FIG. 3 shows polycrystalline material overlying conductive monocrystalline regions 36 and 38, the upward growth of regions 36 and 38 need not be restricted and may reach surface regions of the substrate in process.

Figure 4:
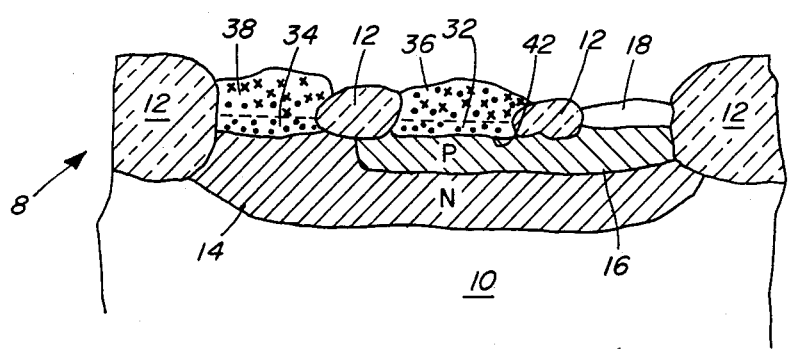

FIG. 4 illustrates the results of the next stage of the fabrication of the transistor 8 in which a conventional plasma or aqueous etch system is used to selectively remove polycrystalline portions 40 of the coating. This step exposes an ideal electrical contact defined by self-registered region 38, integral with previously fabricated n-type region 14 and self-registered contact region 36 integral with active n-type region 32 and the junction 42 in p-type region 16.

Figure 5:
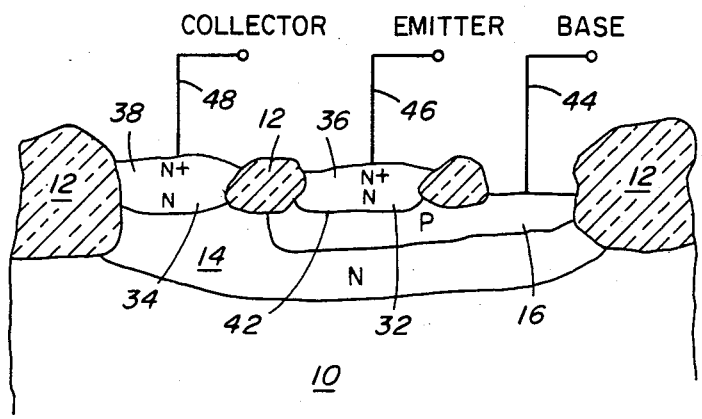
FIG. 5 is a schematic cross section of an improved NPN bipolar transistor made in accordance with the process shown in FIGS. 1-4.

FIG. 5 illustrates a completed NPN bipolar transistor made in accordance with the fabrication technique of the invention after the addition of metallic, e.g. aluminum, electrical conductors 44, 46, and 48 by conventional means operatively linking integrated transistor 8 with other circuit elements (not shown). Conductor 48 is connected to contact 38 which provides a low-resistance electrical link to active region 14 constituting the collector of the transistor. Conductor 44 is connected to p-region 16 constituting the base of the transistor. Conductor 46 is connected to the heavily phosphorus-doped conductive portion 36 of the recrystallized monocrystalline silicon. Contact 36 is integral and in electrical contact with the shallow, annealed, arsenic-doped, active monocrystalline silicone region 32 forming the emitter of the transistor, and defining a junction 42 with p-type region 16. Region 36 insulates and protects active region 32 and junction 42 during deposition of the metallic conductor 46. Thus, the conductor can be applied by conventional techniques without substantial damage to the junction caused by additional arsenic or phosphorus diffusion or by diffusion of aluminum.

Because of the uniformly doped and crystalline nature of the arsenic-doped region 32 and its shallow depth, the N-P junction between the emitter and base of the transistor 8 is characterized by low capacitance and resistance, and consequently a low RC time constant and short switching time. Furthermore, contact 36 is integral with the emitter region 32, and thus the contact resistance of the device is also low. The thickness of contact 36 should in all cases be such as to ensure that additional diffusion of arsenic from emitter region 32 or diffusion of aluminum into the emitter region during deposition of the metallic conductors is minimized. This inherent feature of the process obviates the requirement that a barrier layer be deposited on shallow n-type active regions to protect the junction.

Figure 6:
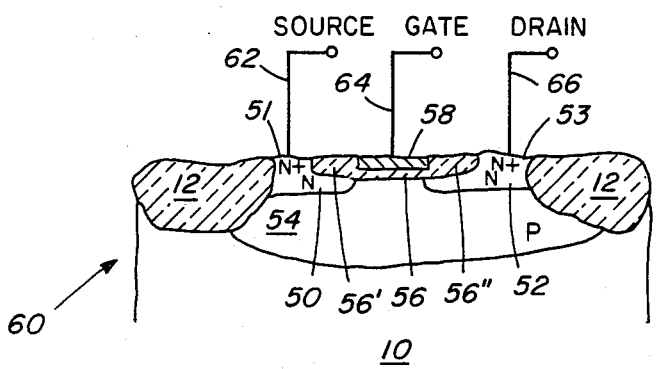
FIG. 6 is a schematic cross section of the improved n-MOS field effect transistor of the invention.

FIG. 6 illustrates an enhancement mode field effect transistor 60 comprising an example of an FET device embodying the invention and fabricated generally as disclosed above. It comprises an n-type source region 50 and drain region 52, each of which form junctions with p-type region 54. Self-registered contacts 51 and 53 overlay regions 50 and 52, respectively. An electrically insulating dielectric layer 56, including lateral regions 56' and 56", separates source and drain regions 50 and 52 and p-type region 54 from a gate 58. The device is isolated on monocrystalline substrate 10 by dielectric regions 12, and connected with other devices in the integrated circuit by metallic conductors 62, 64, and 66.

Integrated transistor 60 differs from prior art FET devices in that source region 50 and its contact 51 and drain region 52 and its contact 53 are fabricated within p-type region 54 in accordance with the process disclosed above. Thereafter additional conventional steps are employed to oxidize portions of the contacts 51 and 53 to form isolating $SiO_2$ dielectric regions 56' and 56". As with the NPN bipolar transistor discussed above, transistor 60 has shallow, annealed n-type active regions of uniform arsenic concentration defining uniform junctions with p-type region 54.

Other embodiments are within the following claims.

What is claimed is:

1. A method of fabricating an n-type silicon region and an associated electrical contact at an exposed surface of a p-type monocrystalline silicon substrate bounded by a dielectric, said method comprising the steps of:
   depositing on said surface an amorphous silicon coating, said coating comprising a first heavily phosphorous-doped layer and an arsenic-doped layer disposed between said phosphorus-doped layer and said surface;
   selectively applying to said coating a sufficient amount of thermal energy to melt said coating; and
   allowing a portion of said coating adjacent said surface to crystallize to produce a phosphorus-doped conductive monocrystalline silicon region and to provide heat sufficient to diffuse arsenic into said monocrystalline silicon substrate to form an annealed n-type monocrystalline silicon region in electrical contact with said p-type conductive silicon region.

2. The method of claim 1 wherein the amorphous coating is deposited on said dielectric, said method comprising the additional steps of allowing portions of said coating on said dielectric to crystallize as polysilicon and removing the polysilicon portions of said coating without removing monocrystalline silicon regions.

3. The method of claim 2 wherein said selectively applying step is effected by exposing said coating to a high energy electron beam or a laser beam.

4. The method of claim 2 wherein said n-type silicon region comprises the emitter of an integrated bipolar transistor.

5. The method of claim 2 wherein said n-type silicon region comprises the source or drain of an integrated metal oxide semiconductor field effect transistor.

6. The method of claim 1 wherein said selectively applying step is effected by exposing said coating to a high energy electron beam or a laser beam.

7. The method of claim 1 wherein said n-type silicon region comprises the emitter of an integrated bipolar transistor.

8. The method of claim 1 wherein said n-type silicon region comprises the source or drain of an integrated metal oxide semiconductor field effect transistor.

* * * * *